(12) United States Patent
Zhong et al.

(10) Patent No.: US 8,470,692 B2
(45) Date of Patent: Jun. 25, 2013

(54) METHOD AND DEVICE FOR PREPARING COMPOUND SEMICONDUCTOR FILM

(75) Inventors: Beijun Zhong, Shenzhen (CN); Wenyu Cao, Shenzhen (CN); Yong Zhou, Shenzhen (CN); Zhanfeng Jiang, Shenzhen (CN)

(73) Assignee: Byd Co., Ltd., Shenzhen (CN)

( * ) Notice: Subject to any disclaimer, the term of this patent is extended or adjusted under 35 U.S.C. 154(b) by 26 days.

(21) Appl. No.: 13/258,174

(22) PCT Filed: Mar. 25, 2010

(86) PCT No.: PCT/CN2010/071333
§ 371 (c)(1),
(2), (4) Date: Sep. 21, 2011

(87) PCT Pub. No.: WO2010/111927
PCT Pub. Date: Oct. 7, 2010

(65) Prior Publication Data
US 2012/0015505 A1    Jan. 19, 2012

(30) Foreign Application Priority Data

Mar. 31, 2009 (CN) .......................... 2009 1 0106258

(51) Int. Cl.
*H01L 21/322* (2006.01)
*H01L 21/469* (2006.01)
*H01L 21/31* (2006.01)
*H01L 21/461* (2006.01)
*H01L 21/44* (2006.01)

(52) U.S. Cl.
USPC ............ 438/477; 438/767; 438/716; 438/687

(58) Field of Classification Search
USPC .................................. 438/477, 767, 716, 687
See application file for complete search history.

(56) References Cited

U.S. PATENT DOCUMENTS

| 7,229,669 B2* | 6/2007 | Youngner et al. ........ 427/255.15 |
| 2003/0005886 A1* | 1/2003 | Park et al. ..................... 118/725 |
| 2007/0087130 A1* | 4/2007 | Arai .............................. 427/457 |

FOREIGN PATENT DOCUMENTS

| CN | 1386898 A | 12/2002 |
| CN | 101245442 A | 8/2008 |
| JP | 9143717 A | 6/1997 |
| JP | 2004231993 A | 8/2004 |

OTHER PUBLICATIONS

International Search Report and Written Opinion, International Application No. PCT/CN2010/071333, Jul. 1, 2010.

* cited by examiner

*Primary Examiner* — Luan C Thai
(74) *Attorney, Agent, or Firm* — Brinks Hofer Gilson & Lione

(57) ABSTRACT

The present invention discloses a method and a device for preparing a compound semiconductor film. The method comprises the steps of: providing a substrate above at least an evaporation source in a vacuum condition; heating a source material contained in the evaporation source so that the source material is vapor-deposited on the substrate; and taking out the substrate under protection of an inert gas. The substrate may be rotated around an axis of a plane where the evaporation source is positioned, and the substrate is tilted by a predetermined angle with respect to the plane. The compound semi-conductive film thus prepared has a uniform thickness with a larger area. The method provides a simplified process and enhanced efficiency.

20 Claims, 2 Drawing Sheets

US 8,470,692 B2

METHOD AND DEVICE FOR PREPARING COMPOUND SEMICONDUCTOR FILM

CROSS REFERENCE RELATED APPLICATION

The present application is the national phase application of PCT Application No. PCT/CN2010/071333, filed Mar. 25, 2010, which claims priority to Chinese Patent Application No. 200910106258.9, filed at SIPO on Mar. 31, 2009, the entireties of both of which are hereby incorporated by references.

TECHNICAL FIELD 0F THE INVENTION

The present invention relates to the field of solar cells, more particularly to a method and a device for preparing a compound semiconductor film respectively.

BACKGROUND 0F THE INVENTION

Solar cells with compounded semiconductor films are one of the most efficient and potential thin-film solar cells. Compound semiconductor material has the highest light absorption coefficient in known semiconductor materials, which may reach up to $10^5$/cm, without semiconductors having S-W effect (Staebler-Wronski Effect). Moreover, converting efficiency thereof may be enhanced by light irradiation. Therefore, this kind of solar batteries may have a long lifespan. It is shown by experiments that compound semiconductor film solar batteries have even longer life span than monocrystalline silicon batteries which may last for normally 40 years. The compound semiconductor is a direct band gap semiconductor material, which is most suitable for film.

Currently, there are many methods for preparing a compound semiconductor film. To overcome disadvantages of the method in the prior art, a vacuum evaporating method was brought forward.

The vacuum evaporating method means that the source material is heated in a container in the vacuum conditions so that atoms or molecules are evaporated or escaped from the surface and form a steam flow onto the surface of the substrate and then condense into a solid thin film. The compound semiconductor thin film solar cell prepared thereof may have high converting efficiency. However, the cell area prepared is far less than 1 cm$^2$, which is mainly limited by emitting characteristics of the evaporation source. While preparing thin film with a large area, the coating material distribution is severely uneven. The larger the scale is, the more uneven the material distribution is. Due to the large area requirement to for the solar cell, this method does not have industrial commerciality.

To improve the method, line movement of the substrate is suggested, with rod-shaped evaporation source for vapor-depositing to form the coating film. Although semiconductor film with a relatively large area may be achieved in this case, the uniformity thereof is still low, normally around ±10%. However, the rod-shaped evaporation source is hard to prepare, because the rod-shaped source shall have the same temperature in each part thereof for uniform evaporation, and shall have no slower or faster evaporation parts existing herein. However, the internal defect distribution inside the evaporation source may affect the evaporating speed or cause slower or faster evaporation at certain parts. Therefore, it is very complex for theoretical calculation to the rod-shaped evaporation source which is hard for processing. Further, the whole apparatus is expensive and needs precise control.

SUMMARY OF THE INVENTION

In viewing thereof, the present invention is directed to solve at least one of the problems existing in the prior art. Accordingly, a method for preparing a compound semiconductor film is provided, in which the difficulty in manufacturing the evaporation source and the film unevenness may be overcome accordingly.

Further, a device for preparing a compound semiconductor film may also need to be provided accordingly.

According to an embodiment of the invention, a method for forming a compound semiconductor film may be provided, which may comprise the steps of: providing a substrate above at least an evaporation source in a vacuum condition; heating source material contained in the evaporation source so that the source material may be vapor deposited on the substrate; and taking out the substrate under protection of inert gas. The substrate may be rotated around an axis that may be normal to a plane where the evaporation source may be positioned, and the substrate may be tilted by a predetermined angle with respect to the plane.

According to another embodiment of the invention, a device for forming a compound semiconductor film on a substrate may be provided, comprising: a casing; a vacuumizing unit for vacuumizing the casing; at least an evaporation source provided in the casing; and a supporting member provided above the at least an evaporation for supporting at least a substrate for forming the compound semiconductor film thereon. The supporting member may be formed with a slanted surface where the at least a substrate is provided.

The compound semi-conductive film prepared according to the method in the present invention has a uniform thickness with larger area. Further, the process is relatively simple, efficient and also easy to realize. Meanwhile, the present invention can be realized by directly modifying the prior evaporation device, and also the modification is easy and investment is low. And it realized large scale substrate by a smaller device, so in practical production, it is more applicable.

Additional aspects and advantages of the embodiments of the present invention will be given in part in the following descriptions, become apparent in part from the following descriptions, or be learned from the practice of the embodiments of the present invention.

BRIEF DESCRIPTION OF THE DRAWINGS

These and other aspects and advantages of the invention will become apparent and more readily appreciated from the following descriptions taken in conjunction with the drawings in which.

DETAILED DESCRIPTION OF THE EMBODIMENTS OF THE INVENTION

Figures 1, 2:
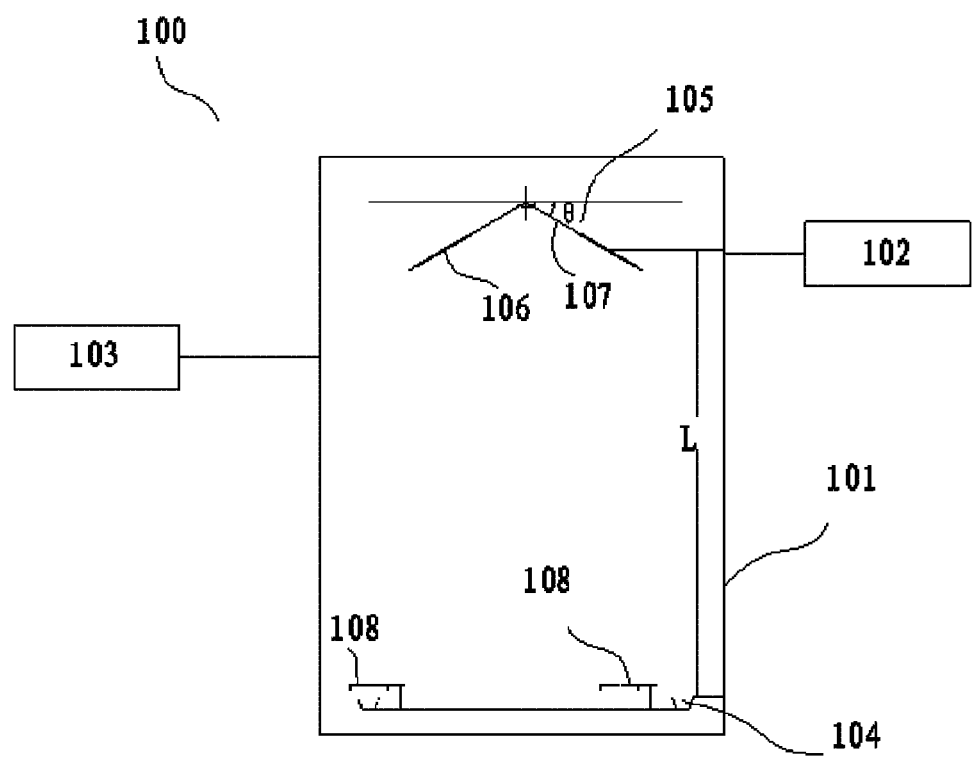
FIG. 1 shows a substrate divided into nine parts according to an embodiment of the invention.
FIG. 2 shows a schematic view of a device for preparing a compound conductor film according to an embodiment of the invention.

Reference will be made in detail to embodiments of the present invention. The embodiments described herein with reference to drawings are explanatory, illustrative, and used to generally understand the present invention. The embodiments shall not be construed to limit the present invention. The same or similar elements and the elements having same or similar functions are denoted by like reference numerals throughout the descriptions.

According to an embodiment of the invention, a method for forming a compound semiconductor film on a substrate may be provided, comprising the steps of: providing a substrate above at least an evaporation source in a vacuum condition; heating source material contained in the evaporation source so that the source material may be vapor deposited on the substrate. The substrate may be rotated around an axis that may be normal to a plane where the evaporation source may be positioned, and the substrate may be tilted by a predetermined angle with respect to the plane.

The compound semiconductor film may be those known in the art, for example a CIS thin film, a CIGS thin film, a CuInS$_2$ thin film, a CIGSS thin film, a CdS thin film, a CdTe thin film and so on.

According to an embodiment of the present invention, the vacuum degree is less than $3.0 \times 10^{-3}$ Pa in the vacuum condition. Further, an evaporation system for implementing the method may be heated to enhance the vacuum degree.

Normally, source material, such as powdered pure metal substance or alloy thereof, may be selected for preparing the required compound semiconductor thin film, for example Cu, In, Ga and Se, or CuSe alloy, InSe alloy and GaSe alloy. Further, CuInGaSe alloy may be directly adopted to prepare the CuInGaSe semiconductor thin film. For preparing a CdTe semiconductor thin film, Cd powder and Te powder may be used, or CdTe powder may as well be used accordingly.

The evaporation source may be that normally known in the art, which will not be described herein for simplicity purpose. An evaporation source may have a blocking plate to be opened during evaporation depositing which is then closed after evaporation depositing. For example, the evaporation source may be a heating evaporation container, after placing the above source material therein, the source material will be heated and vaporized accordingly. Normally, the evaporation source may be divided into a resistance evaporation source, an electronics beam evaporation source, a high frequency inducing evaporation source, a laser beam evaporation source and so on.

The substrate may normally have a square shape made from any kind of glasses or flexible substrate prepared from macromolecular organics. According to an embodiment of the present invention, the substrate may be a NaCa glass which is magnetron sputtered with a layer of Mo electrode substrate having a thickness of 1 μm.

The substrate may be ultrasonically cleaned to ensure cleanness of the substrate.

There may be one or more evaporation sources according to selection of the source material. For example, for a CuInGaSe film, if the CuInGaSe source material is adopted, only an evaporation source may be selected. However, when Cu, In, Ga and Se are adopted as the source materials, four evaporation sources, i.e., a Cu evaporation source, an In evaporation source, a Ga evaporation source and a Se evaporation source, may be adopted accordingly.

The vapor depositing is commonly practiced in the art, and the detailed description thereof is omitted hereby for clarity purpose.

Further, the detailed steps of the present invention will be described as follows:

Firstly, the substrate may be fixed in a slanting or tilted manner over the evaporation source after ultrasonic cleaning. And the source material may be deposited into each evaporation source. Then it is vacuumized, and the substrate is heated up to 300-600° C. and the temperature is maintained to heat the evaporation source and adjust a vapor depositing speed of each evaporation source gradually. And the rotating speed of the substrate may be adjusted. Then, the evaporation depositing may be started. After evaporation depositing, the substrate may be continuously heated for a predetermined period of time so that the compound semiconductor thin film may react more thoroughly. Then, the substrate may be naturally cooled to normal temperature, and the substrate is under the protection of inert gas by slowly filling protection gas. When the pressure may reach atmosphere pressure, the substrate is taken out, and the substrate deposited with a compound semiconductor thin film is provided accordingly.

According to an embodiment of the present invention, the rotating speed of the substrate may be 3-100 r/min.

According to an embodiment of the present invention, the substrate may be tilted by 5-30 degrees with respect to the plane. According to another embodiment of the present invention, the substrate may be tilted by 7-8 degrees with respect to the plane accordingly. It should be noted that the angle between the substrate and the plane in the present invention means the acute angle.

If a plurality of evaporation sources, for example 2 or 4 evaporation sources, are provided, evaporation sources may be evenly distributed on a phantom circle in the plane. For example, the evaporation sources may be located at the equal division points of the circumference of the circle.

According to an embodiment of the present invention, a plurality of substrates may be provided, with a geometric centre thereof being aligned with the center of the circle on a same vertical line to the plane.

According to an embodiment of the present invention, the substrate may have a square shape, and the circle may have a radius which may be 8-10 times of the side length of the substrate.

In this case, since the evaporation sources may uniformly distributed, a plurality of elements, such as Cu, In etc, may be vapor deposited at the same time during the rotation of the substrate. And according to the distribution characteristics of the evaporation gas flows from the evaporation sources, the substrate may be adjusted to be tilted by a predetermined angle with respect to the plane where the evaporation sources are located so that the thickness of the thin film on the substrate may be compensated accordingly. Therefore, the prepared thin film may have a better uniformity and may realize large scale uniform depositing.

According to an embodiment of the invention, each evaporation source may have an evaporation depositing rate of about 0.3-16 nm/min.

The protection gas may be those normally used in the art, for example, it may be highly purified Ar or $N_2$.

The compound semiconductor film prepared may be divided into nine areas with the same shape by dividing the length and width of the film into three parts respectively. The uniformity of the whole film is then measured, with testing results showing that the thickness uniformity thereof falls within ±5% whereas the thickness uniformity of the film prepared by conventional method is about ±17.5%, at most ±10%.

The compound semiconductor film prepared in the present invention, each element is equally distributed and it is easy to control the composition on a film with a larger area. When element distributions on the substrate are analyzed by EDS (Energy-Dispersive Spectrometry), the results show that the elements are distributed evenly on each area. The present invention is most suitable for preparing semiconductor films which may have a stricter requirement to element distributions, such as a CIS layer, a CIGS layer, a $CuInS_2$ layer, a CIGSS layer, a CdS layer and a CdTe layer of polycrystalline film solar battery and so on.

The compound semiconductor film prepared in the present invention has excellent photoelectric performance, the prepared CIGS solar battery with a size of 15×15 $cm^2$ is tested under a light intensity of AM 1.5. The highest battery conversion efficiency may reach 14.93% which may have commercial potentiality.

The present invention inherits advantages of the conventional evaporation, and may control the crystalline quality and electric performance of the film. Meanwhile the process is simple and efficient which is also easy for realization. Besides, the present invention may be achieved by easily and directly modifying the original evaporation depositing device with low cost. And the substrate with a large area, such as 15×15 $cm^2$, may be produced by miniaturized device so that it is more applicable in practical production.

In the following, a device 100 for preparing a compound semiconductor film will be described with reference to accompanying figures.

As shown in FIG. 2, according to one embodiment of the invention, the device 100 may comprise: a casing 101; a vacuumizing unit 102 for vacuumizing the casing 101; at least an evaporation source 104 provided in the casing 101; and a supporting member 105 provided above the evaporation source 104 for supporting substrate 106, such as a glass substrate, for forming the compound semiconductor film thereon. The supporting member 105 may be formed with a slanted surface 107 where the at least a substrate is provided. According to one embodiment of the invention, the device 100 may further comprise a gas supply for supplying inert gas into the casing. The supporting member 105 may be formed into a bracket configured to support substrate 106. Further, the evaporation source 104 may have a blocking cover 108 which is closed when it is not working. The blocking cover 108 is opened when evaporating deposition is started. There is an evaporation distance L between the substrates 106 for forming the compound semiconductor film, which may be adjusted according to evaporating deposition requirements. According to an embodiment of the invention, the slanted surface 107 may be tilted by an angle θ of about 5-30 degrees with respect to the bottom surface. According to an embodiment of the invention, the slanted surface 107 may be tilted by 7-8 degrees with respect to the bottom surface.

Figure 3:
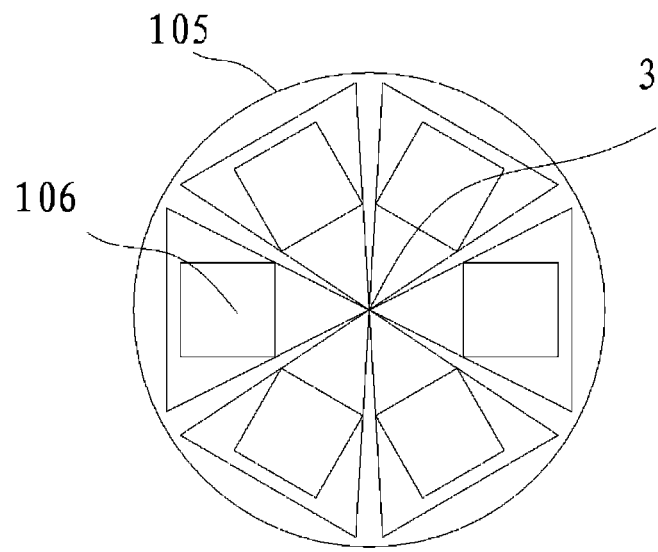
FIG. 3 shows a plan view of a supporting member for supporting substrates according to an embodiment of the invention.

As shown in FIG. 3, the supporting member 105 may be rotatable around an axis 3 thereof, the axis 3 is the geometric center of the supporting member. And the rotating speed thereof may be controlled to about 3-100 r/min. It should be noted that the supporting member 105 is configured to have a relative rotational movement with respect to evaporation source 108 during operation. For example, according to one embodiment of the invention, the supporting member 105 may be stationary, and the evaporation source 108 may be rotatable with respect to the supporting member 105. According to another embodiment of the invention, the supporting member 105 and the evaporation source 108 may be rotatable respectively. However, the rotating speed of the supporting member 105 is different from that of the evaporation source 108, so that there is a relative rotational movement between the supporting member 105 and the evaporation source 108.

As shown in FIG. 3, the substrate 106 may have a square shape. And there may be a plurality of substrates 106 provided on the supporting member 105. It should be noted that there is no limitation to the shape of the substrate, only if the substrate should meet industrial requirement. Thus, the shape illustrated here is just for description rather than limitation.

Figure 4:
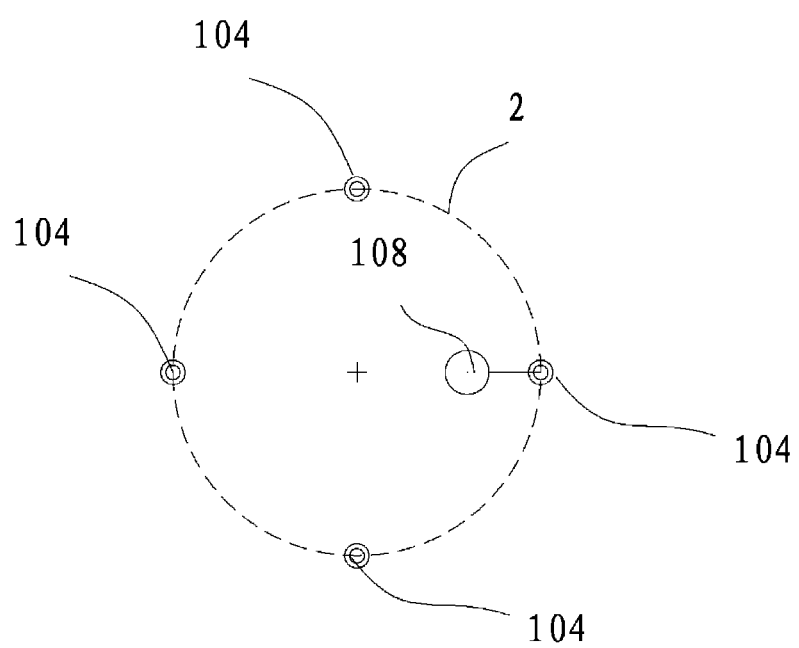
FIG. 4 shows a plan view of the distribution of evaporation sources according to an embodiment of the invention.

As shown in FIG. 4, a plurality of evaporation sources 104 may be provided on a bottom surface of the casing 101. And at least two evaporation sources 104 may be evenly distributed on a phantom circle 2 in the bottom surface. The circle 2 may have a radius which may be about 8-10 times of a side length of the substrate 106. According to an embodiment of the invention, 2 or 4 evaporation sources 104 may be distributed evenly on the bottom surface of the casing 101.

The present invention will be further explained in conjunction with detailed examples.

First Embodiment (1) The substrate after ultrasonic cleaning is fixed by, for example, a substrate clamp and the angle between the substrate and the plane is 8 degrees. The substrate has an area of 15×15 $cm^2$ and it is a NaCa glass which is magnetron sputtered by a layer of Mo electrode substrate having a thickness of 1 μm.

(2) Evaporation sources with Cu, In, Ga and Se are uniformly fixed in a phantom circle at the four quartering points respectively. The circle has a radius of 9 times of the side length of the substrate.

(3) Then, it is vacuumized by the vacuumizing unit 102 to $3.0 \times 10^{-3}$ Pa and the device 100 for implementing the method of the invention is heated to further remove gas contained herein until the vacuum degree reaches up to $2.0 \times 10^{-4}$ Pa. Meanwhile the substrate is heated up to 500° C., then the temperature is maintained thereafter.

(4) The evaporation speed of each evaporation source may be adjusted. The evaporation speed of the Cu evaporation source is about 15 nm/min. The evaporation speed of the In evaporation source is about 12 nm/min; The evaporation speed of the Ga evaporation source is about 7 nm/min; and the evaporation speed of Se evaporation source is about 35 nm/min.

(5) The substrate may have a rotating speed of about 5 rad/min. Normally, evaporation depositing may be started for about 50 minutes after parameters thereof having been preset with the blocking plate of each evaporation source being removed. After the evaporation depositing, the blocking plate is closed. Then, the substrate is heated for 3 minutes, and the substrate is cooled to room temperature in the ambient environment thereafter.

(6) Finally, the vacuumizing system for vacuum pumping is closed with highly purified $N_2$ being slowly injected into the accommodating cavity until an internal pressure thereof may reach atmospherical pressure. Then, the substrate may be taken out with the desired film being formed thereon. The substrate is denominated as A1.

Second Embodiment

Compared with the First Embodiment, the only difference may lie in that the angle between the substrate and the plane is 5 degrees. The radius of the circle is about 8 times of the side length of the substrate. And the rotating speed of the substrate is about 20 rad/min, the remaining features thereof is the same as the First Embodiment, and the substrate may be denominated as A2.

Third Embodiment

Compared with the First Embodiment, the only difference may lie in that the angle between the substrate and the plane is 30 degrees. The radius of the circle is ten times of the side length of the substrate. The rotating speed of the substrate is about 90 rad/min, the remaining features are the same as the First Embodiment, and the substrate may be denominated as A3.

Fourth Embodiment

The Fourth Embodiment is substantially the same as the First Embodiment, with the only difference lying in that the substrate is replaced by a substrate with a CdS layer being formed by Chemical Bath Deposition (CBD deposition). Besides, the evaporation source materials are replaced by metals Cd and Te with the evaporation speed being adjusted to 32 nm/min and 47 nm/min respectively. And the rotating speed thereof is about 90 rad/min with the evaporation time being 33 minutes. The remaining features are the same as those in the First Embodiment. The substrate may be denominated as A4.

Fifth Embodiment

Compared with the Fourth Embodiment, the only difference may lie in that the rotating speed of the substrate is adjusted to 5 rad/min with a tilting angle of the substrate being about 30 degrees. The remaining features are substantially the same as those in the Fourth Embodiment. The substrate may be denominated as A5.

First Comparative Embodiment

The only difference with the First Embodiment may lie in that the substrate is placed in parallel with the plane rather than tilted. The remaining features are the same as those in the First Embodiment. Finally, the obtained substrate in this comparative embodiment may be denominated as D1.

Second Comparative Embodiment

The only difference with the First Embodiment may lie in that the substrate is tilted by 35 degrees with respect to the plane, with the remaining features being substantially the same as those in the First Embodiment. Finally, the obtained substrate in this comparative embodiment may be denominated as D2.

Third Comparative Embodiment

The only difference with the Fourth Embodiment may lie in that the substrate is tilted by 35 degrees with respect to the plane. The remaining features are substantially the same as the Fourth Embodiment. And the substrate is denominated as D3.

Performance Test

Uniformity of Film Thickness

Films A1-A5 and films D1-D3 are divided into nine areas according to FIG. 1. The film thickness in each area is tested by a step profiler, such as a Xp-2 step profiler normally practiced in the art. The thickness is denominated as $x_1, x_2, x_3, x_4, x_5, x_6, x_7, x_8$, and $x_9$ respectively. The average value of $x_1, x_2, x_3, x_4, x_5, x_6, x_7, x_8$, and $x_9$ is denominated as $x_0$. In the present invention, the maximum value and the minimum value of $(x_i - x_0)/x_0$ (i=1~9) are used to evaluate the uniformity of the film thickness.

Light Conversion Efficiency

The light conversion efficiency is calculated by measuring J-V characteristics of a battery. The testing of the J-V characteristic of the battery is performed under a sun light simulator with a light intensity of AM1.5 in a laboratory, and a xenon lamp is adopted as the light source. The light intensity of the simulator is calibrated by a monocrystalline Si standard battery provided by 205 metering station, the 18th Electronic Research Institute, Tianjin. And the output power of the light source in the simulator is adjusted so that the short circuit current may reach a calibration value with a battery testing temperature of 25° C.

Uniformity of Chemical Content in Film

The films A1-A5 and D1-D3 are divided into nine areas according to FIG. 1. And the atomic ratio in each area is tested by a QUEST X-Ray spectrometer distributed by NORAN Inc., United States of America. The atomic ratio is denominated as $y_1, y_2, y_3, y_4, y_5, y_6, y_7, y_8$ and $y_9$ respectively. The average of $y_1, y_2, y_3, y_4, y_5, y_6, y_7, y_8$ and $y_9$ may be denominated as $y_0$. The maximum value and the minimum value of $(y_i - y_0)/y_0$ (i=1~9) are used to evaluate the uniformity of the film thickness.

TABLE 1

| Embodiment/Comparative Embodiment | Uniformity of Thickness | Light Conversion Efficiency |
| --- | --- | --- |
| A1 | ±1.2% | 14.939% |
| A2 | ±3.17% | 10.930% |
| A3 | ±2.56% | 11.341% |
| D1 | −8.36%~8.07% | 2.419% |
| D2 | −9.07%~7.56% | 2.851% |

TABLE 2

| Embodiment/Comparative Embodiment | Uniformity of thickness | Uniformity of chemical content |
| --- | --- | --- |
| A4 | ±2.8% | −1.35%~2.8% |
| A5 | ±4.7% | −3.98%~4.77% |
| D3 | −9.65%~8.07% | −11.3%~35.8% |

From table 1, it can be concluded that the uniformity of the film thickness has been enhanced tremendously during the preparation of the CuInGaSn film. And the light conversion efficiency is enhanced to a great extent.

From table 2, it can be concluded that the uniformity of the film thickness has been enhanced obviously during the preparation of the CdS film. And the uniformity of the chemical content is enhanced to a large extent.

Although explanatory embodiments have been shown and described, it would be appreciated by those skilled in the art that changes, alternatives, and modifications can be made in the embodiments without departing from spirit and principles of the invention. Such changes, alternatives, and modifications all fall into the scope of the claims and their equivalents.

What is claimed is:

1. A method for preparing a compound semiconductor film, comprising:
   providing at least one source material in an evacuated container;
   rotating the source material;
   providing a substrate in the container, wherein the substrate is disposed above the source material, wherein the substrate forms an angle of 5 to 30 degrees with respect to a horizontal plane;
   rotating the substrate;
   evaporating the source material;

depositing the source material on the substrate while it is being rotated to provide a compound semiconductor film on the substrate; and
applying an inert gas.

2. The method of claim 1, wherein the angle is 7 to 8 degrees.

3. The method of claim 1, wherein rotating is at a speed of 3-100 r/min.

4. The method of claim 1, wherein at least two source materials are provided; wherein the source materials are placed on the same plane; and wherein the source materials are evenly distributed around a circle on the plane.

5. The method of claim 4, wherein the substrate has a square shape, and wherein the circle has a radius 8-10 times of the side length of the substrate.

6. The method of claim 5, wherein the substrate has a geometric center aligned with the center of the circle on a same vertical line to the plane; and wherein the substrate is rotating around the geometric center.

7. The method of claim 1, wherein a plurality of substrates are provided.

8. The method of claim 1, wherein the source material is deposited on the substrate at a speed of about 0.3-16 nm/minute.

9. The method of claim 1, wherein the source material is vapor-deposited on the substrate for about 30-60 minutes.

10. The method of claim 1, wherein the substrate has a temperature of about 300-600° C. during vapor-depositing.

11. The method of claim 1, further comprising:
cleaning the substrate.

12. The method of claim 1, further comprising:
heating the deposited substrate for a predetermined time.

13. The method of claim 1, wherein the inert gas is $N_2$ or Ar.

14. The method of claim 1, wherein the source material comprises Cu, In, Ga and Se.

15. The method of claim 1, wherein the substrate is glass coated with a layer of Mo.

16. A device for preparing a compound semiconductor film, comprising:
a container having an upper portion and a bottom plate, wherein the bottom plate is rotatable around its geometric center; and
a supporting member disposed in the upper portion of the casing, wherein the supporting member has a slanted surface so that a substrate disposed on the surface of the supporting member forms an angle of 5 to 30 degrees with respect to the bottom plate, and wherein the supporting member is rotatable around its geometric center.

17. The device of claim 16, further comprising a vacuumizing unit for vacuumizing the container.

18. The device of claim 16, further comprising a gas supply for providing an inert gas into the container.

19. The device of claim 16, wherein the thickness of the supporting member tapers from the edge of the supporting member to the center of the supporting member, so that the supporting member has a slanted surface to support the substrate.

20. The device of claim 16, wherein the slanted surface forms an angle of 7-8 degrees with respect to the bottom plate.

* * * * *